United States Patent [19]

Beitman

[11] Patent Number: 4,929,566
[45] Date of Patent: May 29, 1990

[54] METHOD OF MAKING DIELECTRICALLY ISOLATED INTEGRATED CIRCUITS USING OXYGEN IMPLANTATION AND EXPITAXIAL GROWTH

[75] Inventor: Bruce A. Beitman, Palm Bay, Fla.

[73] Assignee: Harris Corporation, Melbourne, Fla.

[21] Appl. No.: 376,019

[22] Filed: Jul. 6, 1989

[51] Int. Cl.⁵ .................. H01L 21/20; H01L 21/265; H01L 21/76
[52] U.S. Cl. ........................... 437/24; 437/26; 437/62; 437/89
[58] Field of Search ............... 437/24, 62, 89, 26

[56] References Cited

U.S. PATENT DOCUMENTS

| | | | |
|---|---|---|---|
| 4,255,207 | 3/1981 | Nicolay et al. | 437/67 |
| 4,412,868 | 11/1983 | Brown et al. | 437/89 |
| 4,566,914 | 1/1986 | Hall | 437/89 |
| 4,612,701 | 9/1986 | Cox | 437/72 |

FOREIGN PATENT DOCUMENTS

| | | | |
|---|---|---|---|
| 59-55035 | 3/1984 | Japan | 437/56 |
| 60-144950 | 7/1985 | Japan | 437/62 |
| 8701239 | 2/1987 | PCT Int'l Appl. | 437/89 |

*Primary Examiner*—Olik Chaudhuri
*Attorney, Agent, or Firm*—Barnes & Thornburg

[57] ABSTRACT

A method includes forming an oxide layer on the substrate of a first thickness and patterning the insulative layer to form the laterally dielectric walls in exposed island areas of the substrate. The islands are epitaxially grown on the exposed surface of the substrate to a second thickness to form the laterally dielectrically isolated islands. For totally dielectrically isolated islands, the second thickness is less than the first thickness and a horizontal dielectric isolation is formed in the epitaxial layer by ion implanting oxygen. This is followed by increasing the island thickness to the first thickness by further epitaxial growth.

9 Claims, 2 Drawing Sheets

METHOD OF MAKING DIELECTRICALLY ISOLATED INTEGRATED CIRCUITS USING OXYGEN IMPLANTATION AND EXPITAXIAL GROWTH

BACKGROUND AND SUMMARY OF THE INVENTION

The present invention relates generally to lateral dielectric isolation and more specifically to the process of creating laterally dielectrically isolated islands.

Integrated circuits generally includes epitaxial layers formed on a heavily doped substrate. The epitaxial layer is divided into islands which are laterally dielectrically isolated. This structure is illustrated in FIG. 1. The process of the prior art to form these laterally dielectrically isolated islands includes forming the epitaxial layer on the heavily doped substrate, creating trenches which extend down through the epitaxial layer to the substrate and then filling the trenches by depositing or growing oxide in the trenches. This is followed by an etch back to produce a planar surface. Generally, the tops of the oxides are recessed and therefore it is difficult to form a truly planarized surface.

A typical example of growing lateral dielectric isolation is illustrated in U.S. Pat. No. 4,612,701 to Cox. The filling by oxide deposition is shown in U.S. patent application Ser. No. 07/281,546, filed Dec. 8, 1988, and assigned to the same assignee as the present application. An example of providing lateral dielectric isolation with polycrystalline fill is illustrated in U.S. Pat. No. 4,255,207 to Nicolay et al..

Thus, it is an object of the present invention to provide a method for forming the structure of FIG. 1 without the attendant problems of the prior art.

These and other objects are achieved by forming an insulative layer on the substrate of a first thickness and patterning the insulative layer to form the laterally dielectric walls and exposed island areas of the substrate. The islands are epitaxially grown on the exposed surface of the substrate to a second thickness to form the laterally dielectrically isolated islands. The insulative layer is patterned by using plasma etching. A sacrificial oxide layer is formed over the exposed areas of the substrate and removed with a chemical etch to expose fresh island areas of the substrate for epitaxial deposition.

Impurities of a conductivity type opposite that of the epitaxial layer may be introduced into selective islands to change its conductivity type. Also, exposed areas of the substrate, which is of the same conductivity type as the epitaxial layer, may have opposite conductivity type impurities introduced where the selected islands of the to be changed conductivity type are to be formed to produce a retrograde island.

For islands which include only lateral dielectrical isolation, the first thickness of the dielectric layer and the second thickness of the epitaxial layer are equal to form a planar surface. Where totally dielectrically isolated islands are to be formed, the first epitaxial step forms an epitaxial layer of a second thickness less than the first thickness. This is followed by implanting oxygen into the epitaxial layer to form a horizontal dielectric isolation wall extending laterally between the lateral dielectric walls and displaced from the top surface of the epitaxial island. Subsequent to the oxygen implantation, a second epitaxial step is formed to increase the total thickness of the island to the first thickness of the lateral dielectrical walls.

Other objects, advantages and novel features of the present invention will become apparent from the following detailed description of the invention when considered in conjunction with the accompanying drawings.

DETAILED DESCRIPTION OF THE DRAWINGS

Figure 1:
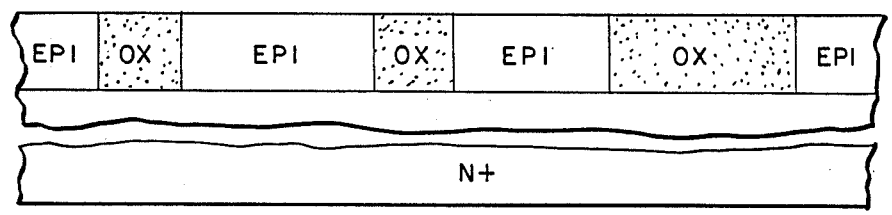
FIG. 1 is a cross-sectional view of a wafer of a laterally dielectrically isolated island of the prior art.
Figure 2:
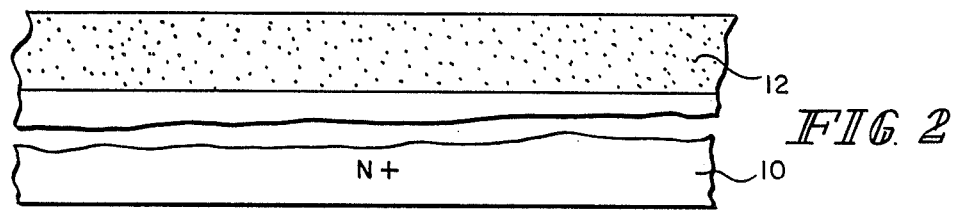
FIGS. 2-5 are cross-sectional views of wafers at various stages of fabrication according to the principles of the present invention.
Figure 3:
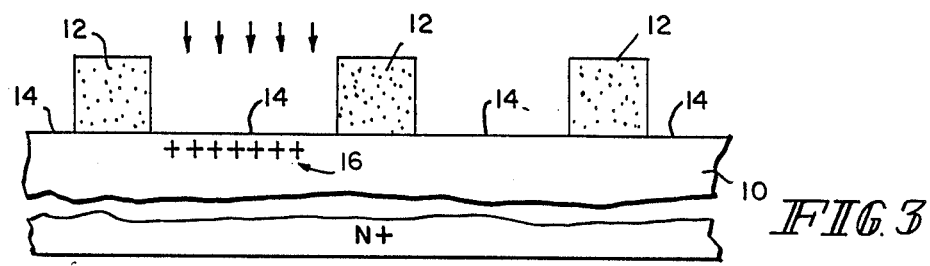

A substrate 10, which may be heavily doped N+, as illustrated in FIG. 2, has an insulative layer 12 formed thereon. The insulative layer 12 may be deposited or thermally grown to a thickness of approximately 10K Angstroms, or one micron. A mask is formed on the wafer and portions of the insulative layer 12 are removed to form lateral dielectric isolation walls 12 and exposed areas 14 of the substrate 10. Preferably, the oxide layer is removed by plasma etching to assure a substantially vertical edge to the lateral isolation walls. To remove any surface damage to the substrate 10 resulting from the plasma etching, a sacrificial oxide layer of approximately 300 Angstroms is grown on the substrate and removed by a chemical etchant, for example a hydrogen floride dip. This produces fresh surface areas 14 of the substrate 10, as illustrated in FIG. 3.

If the integrated circuit is to have islands of different conductivity type and it is also desirable that one of the different conductivity type islands has a retrograded impurity distribution, the surface area 14 of the substrate 10 in which this opposite conductivity type island is to be formed has impurities introduced. As illustrated in FIG. 3, P type impurities are introduced by ion implantation as represented by the + symbol 16.

Figure 4:
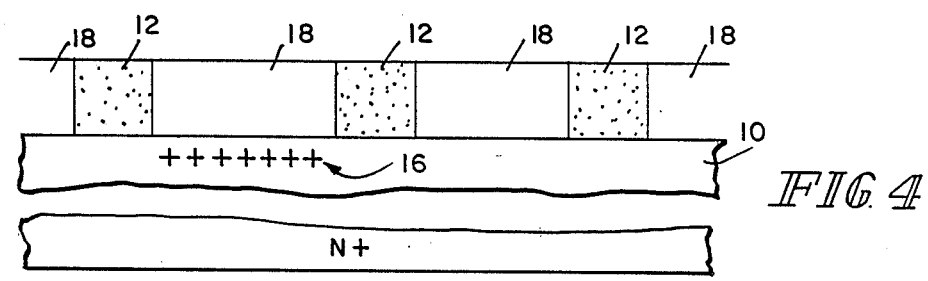

N type layer is epitaxially formed on the exposed portions of the substrate to a thickness equal to that of the lateral oxide walls 12 to form the epitaxial islands 18. The resulting structure is illustrated in FIG. 4. Preferably, the process is controlled to selectively form the epitaxial island 18 with no growth on the oxide walls 12. If the process results in some growth on the top of the oxide walls 12 or nonselective epitaxy is performed, the oxide walls 12 act as a grinding stop to remove the material formed on the oxide walls and planarize the islands 18.

Figure 5:
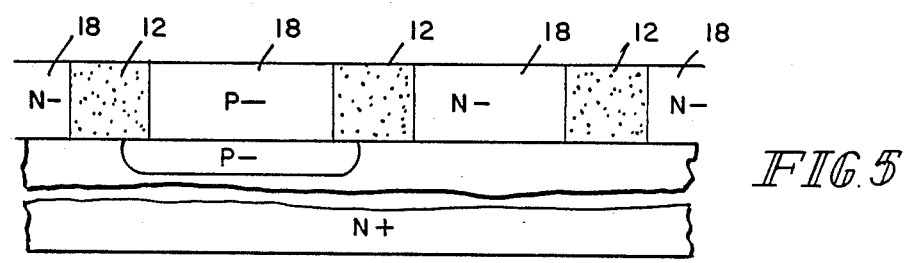

The substrate is then processed through a masking step to expose the islands in which P type wells are to be formed and P type impurities are introduced. A heating step is performed to drive in the P type impurities to the bottom of the island and activate the ion implanted impurities. The resulting structure is illustrated in FIG. 5, showing approximately four N− islands 18 with one P− island 18 and a P− region 16 in the substrate 10. If a retrograde island is not desired, the implantation of impurities into substrate 10 of FIG. 3 may be deleted. If all the islands are to have the same conductivity type, the selective introduction of impurities into one of the islands of the step of FIG. 5 may also be deleted.

Figure 6:
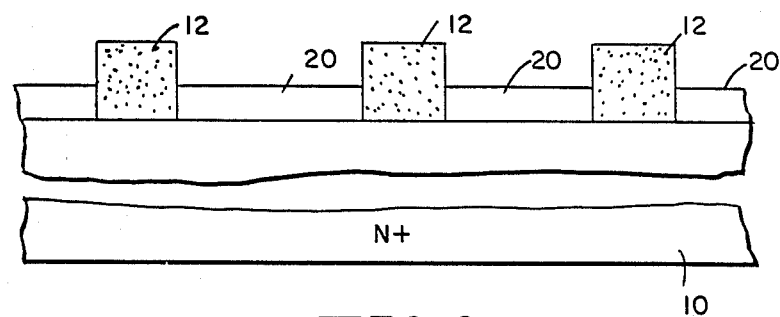
FIGS. 6-8 are wafers at various stages of fabrication according to the principles of the present invention to produce totally dielectrically isolated islands.
Figure 7:
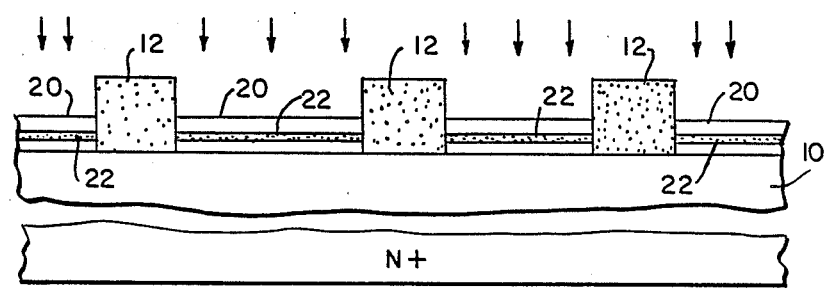
Figure 8:
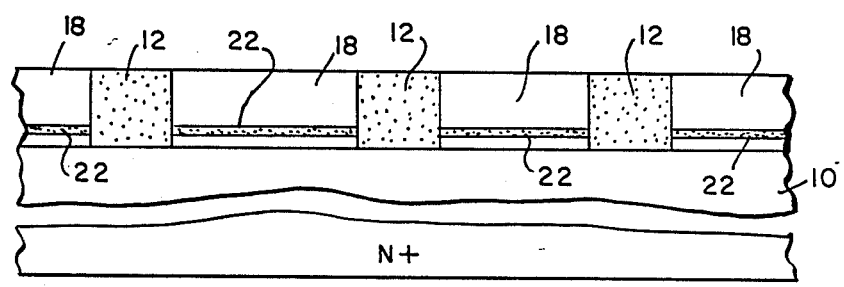

The structure of FIG. 5 produces islands 18 laterally isolated by dielectric isolation regions 12 and being connected through the substrate 10. The present process may also be used to form totally dielectrically isolated islands as illustrated in FIG. 6-8.

The initial process steps of forming and patterning the insulative layer 12 on the substrate 10 up to and including that illustrated in FIG. 3 without the ion implantation of the impurity 16 and also the step of removing the damaged surface of the substrate 10 to provide a fresh exposed surface, are performed. The epitaxial process of FIG. 4 is carried out to form an epitaxial layer 20 of a thickness less than the thickness of the insulative walls 12 as illustrated in FIG. 6.

Oxygen is implanted into the epitaxial layer 12 by high dose oxygen implantation known as SIMOX to form a dielectric horizontal isolation region 22 extending between the vertical dielectrical isolated walls 12. After the implant, the wafer is annealed to form the horizontal dielectric isolation 22. This is shown in FIG. 7.

The thickness 20 of the epitaxial layer is slightly greater than the desired distance of separation of the horizontal dielectric isolation wall 22 from the substrate 10. For example, the thickness of the original epitaxial layer 20 may be in the range of 0.1 microns to 0.5 microns for a one micron or 10K Angstroms laterally dielectric isolation wall 12 and the horizontal dielectric isolation 22 should be in the epitaxial layer and not below the top surface of the substrate 10.

The epitaxial deposition is continued to increase the height of the original epitaxial layer 22 to that of the lateral dielectric isolation wall 12. The resulting structure is shown in FIG. 8, wherein the islands 18 are totally dielectrically isolated laterally and along their bottom edges. One of the islands of the structure of FIG. 8 may be modified by selective introduction of P type impurities as discussed for FIG. 5 above. If a retrograde island is also desired, P type impurities can be ion implanted into the first epitaxial layer 20 of FIG. 7 before the second epitaxial growth is performed.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of forming an integrated circuit having laterally dielectrically isolated islands comprising:

forming a first insulative layer of a first thickness on a substrate;

patterning said first insulating layer to form lateral dielectric walls and exposed island areas of said substrate;

epitaxially growing islands of a first conductivity type on exposed island areas of said substrate to a second thickness less than said first thickness;

implanting an oxygen into said epitaxial island to form a horizontal dielectric isolation wall extending lateral between said lateral dielectric walls and displaced from a top surface of said epitaxial island to form totally dielectrically isolated islands; and epitaxially increasing the total thickness of said islands to said first thickness subsequent to implanting said oxygen.

2. A method according to claim 1, including selectively introducing second conductivity type impurities into selected islands to change said selected islands to said second conductivity type.

3. A method according to claim 2, wherein said second conductivity type impurities are introduced by ion implantation.

4. A method according to claim 1, wherein said patterning is performed by plasma etching.

5. A method according to claim 4, including oxidizing said exposed areas of said substrate to form a sacrificial oxide and chemically etching to remove said sacrificial oxide to expose fresh island areas of said substrate.

6. A method according to claim 2, including introducing second conductivity type impurities into selected islands of said second thickness which is less than said first thickness.

7. A method according to claim 1, wherein said epitaxially growing steps are performed selectively to grow only on said exposed island areas.

8. A method according to claim 1, wherein said epitaxially growing steps are performed non-selectively and including removing epitaxially grown material from over said lateral dielectric walls.

9. A method according to claim 8, wherein removing includes grinding down to said lateral dielectric walls.

* * * * *